(12) United States Patent
Tsuzuki et al.

(10) Patent No.: US 7,393,122 B2
(45) Date of Patent: Jul. 1, 2008

(54) LAMP

(75) Inventors: Atsushi Tsuzuki, Aichi-ken (JP); Yuji Takahashi, Aichi-ken (JP); Toshimasa Hayashi, Aichi-ken (JP); Katsunori Arakane, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 453 days.

(21) Appl. No.: 11/239,470

(22) Filed: Sep. 30, 2005

(65) Prior Publication Data
US 2006/0101757 A1    May 18, 2006

(30) Foreign Application Priority Data
Oct. 4, 2004    (JP)    .............................. 2004-292024

(51) Int. Cl.
*F21V 33/00*    (2006.01)
(52) U.S. Cl. ........................ 362/304; 362/800; 362/346; 362/297
(58) Field of Classification Search ................. 362/545, 362/800, 341, 346, 296, 297, 301, 302, 304
See application file for complete search history.

(56) References Cited
U.S. PATENT DOCUMENTS
6,443,597 B1 * 9/2002 Natori ........................ 362/304

6,953,952 B2 * 10/2005 Asakawa ..................... 257/103
2004/0075100 A1 * 4/2004 Bogner et al. ................. 257/99
2007/0001187 A1 * 1/2007 Kim ............................. 257/98

FOREIGN PATENT DOCUMENTS
JP    08-264842    10/1996
JP    2004-193537    7/2004

* cited by examiner

*Primary Examiner*—Laura Tso
(74) *Attorney, Agent, or Firm*—McGinn IP Law Group, PLLC

(57) ABSTRACT

The present invention provides a lamp that includes a reflection case and a light emitting element. A central portion of a lower wall inner face of the reflection case is stepwise lowered to form a lower wall enlarged inner face, and both faces are made continuous with each other through right and left perpendicular hanging inner faces, so that a central portion of a back wall inner face and a front opening are downwardly enlarged in a rectangular shape, respectively. The light emitting element is mounted on a front face of a sub mount table. A back face of the sub mount table is fixed to the central portion of the back wall inner face, and right and left end faces of the sub mount table are positioned to right and left perpendicular hanging inner faces when the sub mount table is fixed.

6 Claims, 4 Drawing Sheets

LAMP

BACKGROUND OF THE INVENTION

1. Field of the Invention

The present invention relates to a lamp constructed by providing an LED (light emitting diode) chip to a reflection case having an opening at the front side thereof.

2. Description of the Related Art

A plane light emitting device for making light from a light source incident to an end face of a light guide plate and emitting light in the form of a plane from the light emitting face of the light guide plate is used for liquid crystal back light, a panel meter, a display lamp, a plane light emitting switch or the like. With respect to lamps used as one type of light sources, it is required to design the lamps as a thin type in connection with the thickness of the light guide plate, and thus it is general to use a lamp constructed by providing a light emitting element to a thin reflection case having a front opening. For example, Japanese laid-open patent publication number Hei 8-264842 describes a lamp shown in FIG. 3. This lamp 120 is constructed by a synthetic resin reflection case 100 including an upper wall inner face 101 and a lower wall inner face 102 disposed to confront each other at a relatively small interval, right and left side wall inner faces 103 disposed to confront each other at a relatively large interval, a back wall inner face 104, a recess portion 105 surrounded by the inner faces 101 to 104, and a front opening 106. In this construction, a light emitting element 110 is provided to the back wall inner face 104, and the electrodes of the light emitting element 110 are connected to leads 112 provided to the reflection case 100.

Furthermore, as shown in FIGS. 4A and 4B, Japanese laid-open patent publication number 2004-193537 describes a lamp 130 which is constructed by providing a projecting portion 111 (hatched portion in FIG. 4A) at the lower side of a recess portion 105 and a front opening 106, stepwise lowering the center portion in the width direction of a lower wall inner face 102 so as to form an inner wall face 107, and continuously forming an inner wall face 108 so that the inner wall face 108 is inclined from the lower wall inner face 102 to the inner wall face 107 at a predetermined angle as shown in FIGS. 4A and 4B. This publication describes that the "predetermined angle" of the inner wall face 108 is any angle at which the inner wall face 108 is neither parallel nor perpendicular to the lower wall inner face 102 and the inner wall face 107 and light from the light emitting element can be efficiently reflected in the frontward direction of the light emitting device. Accordingly, light output from the light emitting element 110 is immediately reflected in the direction to the principal face of the light emitting device by the inner wall face 108, so that the light take-out efficiency of the light emitting device can be enhanced.

SUMMARY OF THE INVENTION

However, in the lamp 120 described above, the light emitting element 110 is directly fixed to the synthetic resin back wall inner face 104. Therefore, with respect to light output from the light emitting element 110, a lot of light leaks from the back wall inner face 104, and thus the optical loss is large.

In the latter lamp 130, the lead 112 is exposed at the back wall inner face 104, and the light emitting element 110 is fixed to the lead 112, so that the amount of the light leak is small. However, since an LED chip which is generally used as the light emitting element 110 is very small, it is difficult to directly fix the LED chip to the back wall inner face 104 at the bottom of the deep recess portion 105. Furthermore, the dimension (particularly the lateral width) of the back wall inner face 104 is larger than the dimension of the light emitting element 110, and when the light emitting element 110 is fixed, the fixing position thereof is hardly settled to a normal position of the back wall inner face 104. Therefore, the light emitting element 110 is fixed while greatly shifted from the normal position (particularly laterally) or inclined, and subsequent wire connection (for example, the wire connection between the electrodes of the light emitting element and the leads) is difficult due to indetermination of the position, or dispersion may occur in the light condensing degree of the reflection case 100.

An object of the present invention is to solve the above problem and provide a lamp in which not only a light emitting element can be easily mounted on a sub mount table, but also the sub mount table can be automatically positioned when the sub mount table is fixed to a back wall inner face of a reflection case, so that the subsequent wire connection can be easily performed while the fixing position is fixed, and the light condensing degree of the reflection case can be kept constant.

According to the present invention, a lamp comprises: a reflection case having upper and lower wall inner faces disposed so as to confront each other at a relatively small interval, right and left side wall inner faces disposed so as to confront each other at a relatively large interval, a back wall inner face, a recess portion formed so as to be surrounded by the above inner faces, and a front opening; and a light emitting element provided on the back wall inner face, the electrodes of the light emitting element being connected to leads provided to the reflection case. A central portion in the width direction of the lower wall inner face is stepwise lowered to form a lower wall enlarged inner face, and the lower wall inner face and the lower wall enlarged inner face are made continuous with each other through right and left perpendicular hanging inner faces, so that a central portion in the width direction of the back wall inner face and a central portion in the width direction of the front opening are downwardly enlarged in a rectangular shape, respectively. The light emitting element is mounted on the front face of a sub mount table having an erected rectangular plate shape, the back face of the sub mount table is fixed to the central portion in the width direction of the back wall inner face, and when the sub mount table is fixed, right and left end faces of the sub mount table are positioned to right and left perpendicular hanging inner faces.

[Reflection Case]

Here, the material of the reflection case is not limited to a specific material, however, a synthetic resin is preferable because many reflection cases can be simultaneously formed by injection molding or the like. The synthetic resin is not limited to a specific material, and various resins such as a nylon resin, a liquid crystal polymer, a polybutylene terephthalate or the like may be used.

The perpendicular hanging inner face is a face hanging perpendicularly down from the lower wall inner face. Here, "perpendicular hanging" is not limited to a case where the intersecting angle between the lower wall inner face and the perpendicular hanging inner face is strictly equal to 90 degrees, and it means that the intersecting angle ranges from 90 degrees to 100 degrees, which can be regarded substantially as "perpendicular hanging" in consideration of die-cut, etc. after the injection molding. It is preferable that the interval between the right and left perpendicular hanging inner faces (that is, the lateral width of the lower wall enlarged inner face) is slightly (0.01 to 0.5 mm, preferably 0.1 to 0.4 mm)

larger than the lateral width of the sub mount. This resides in the purpose for positioning the right and left end faces of the sub mount table. The height of the perpendicular hanging inner face (that is, the step-down amount of the lower wall enlarged inner face) is not limited to a specific value, and when the end portion of the lead is protruded to the outer face (lower face) of the lower wall of the reflection case, it is preferable that the height of the handing inner face is 0.5 to 1 time of the height of the end portion of the lead. Furthermore, it is also preferable that the interval at the back wall inner face side between the lower wall enlarged inner face and the upper wall inner face (that is, the longitudinal width of the central portion in the width direction of the back wall inner face) is slightly (0.01 to 0.5 mm, preferably 0.1 to 0.4 mm) larger than the longitudinal width of the sub mount table.

[Light Emitting Element]

The light emitting element is not limited to a specific one, however, an LED chip may be preferably used. With respect to the LED chip, as the kind of semiconductor materials, gallium nitride type, zinc selenium type, gallium arsenic type, gallium phosphorous type or the like maybe used. As the kind of the emitted light color, infrared light, red-color light, orange-color light, green-color light, blue-color light, ultraviolet light or the like may be used. Particularly, in order to construct a white color lamp, it is preferable that (1) a blue-color LED chip is used, and a fluorescent material for emitting fluorescent light having complementary color relation to blue color (which produce white color by combining with blue color) is provided to the recess portion of the reflection case, or (2) a ultraviolet LED chip is used, and fluorescent materials for emitting fluorescent light of each of red, green and blue are provided to the recess portion of the reflection case.

The LED chip may be designed in a flip chip structure that both n-electrode and p-electrode confront lead, in a structure that both n-electrode and p-electrode are at the light emission face side, and in a structure that n-electrode and p-electrode are separated to both sides of the chip. However, it is preferable that the LED chip having the flip chip structure is used, and the n-electrode and the p-electrode of the LED chip concerned are connected to a metal pattern disposed on the front face of the sub mount table through a bump. In this structure, heat of the LED chip is efficiently transferred to the sub mount, and the light emission face side is not intercepted by the n-electrode and the p-electrode, so that brightness can be easily increased.

[Sub Mount Table]

The material of the sub mount table is not limited to a specific material, however, ceramics such as AlN, $Al_2O_3$ or the like, or a zener diode of silicon may be used. The longitudinal width of the sub mount table is not limited to a specific value, however, it is preferable that it is equal to or slightly larger (0.01 to 0.2 mm) than the longitudinal width of the light emitting element. This resides in the purpose for positioning the upper and lower end faces of the sub mount table. The lateral width of the sub mount table is not limited to a specific value, however, it is preferable that the sub mount table is designed to have an erected rectangular plate shape which is laterally longer than the lateral width of the LED chip so that the metal pattern is exposed to the front side at the left-handed and right-handed sides of the LED chip (for wire bonding with the leads).

The metal of the metal pattern disposed on the front face of the sub mount table is not limited to a specific material, however, it is preferable that at least the surface is formed of Al having high light reflectivity (particularly, reflectivity to blue color). Furthermore, if Au exists in the lower layer of Al, when Au which is preferable as a bump is used, the connection with the bump concerned is excellent.

[Lead]

A manner of providing the lead to the reflection case is not limited to a specific manner, however, it is preferable to use a lead inserted in the injection molding process of the reflection case. Furthermore, it is preferable that the lead is exposed to at least the central portion in the width direction of the back wall inner face, and the back side of the sub mount table is fixed to the lead. This fixing method is not limited to a specific one, however, it is preferable to use the excellent heat transfer material which is easily handled such as silver paste, solder or the like.

According to the lamp of the present invention, not only the light emitting element can be easily mounted on the sub mount table, but also the positioning of the sub mount table can be automatically performed when the sub mount table is fixed to the back wall inner face of the reflection case. Accordingly, there can be provided a lamp in which the subsequent wire connection can be easily performed because the position is fixed, and the light condensing degree of the reflection case can be kept constant.

BRIEF DESCRIPTION OF THE DRAWINGS

FIGS. 1A to 1C show a lamp of an embodiment according to the present invention, wherein FIG. 1A is a front view, FIG. 1B is a cross-sectional view taken along Ib-Ib of FIG. 1A, and FIG. 1C is a cross-sectional view taken along Ic-Ic of FIG. 1A;

FIGS. 4A and 4B show another conventional lamp, wherein FIG. 4A is a front view and FIG. 4B is a cross-sectional view.

DETAILED DESCRIPTION OF THE PREFERRED EMBODIMENT

Figure 1A:
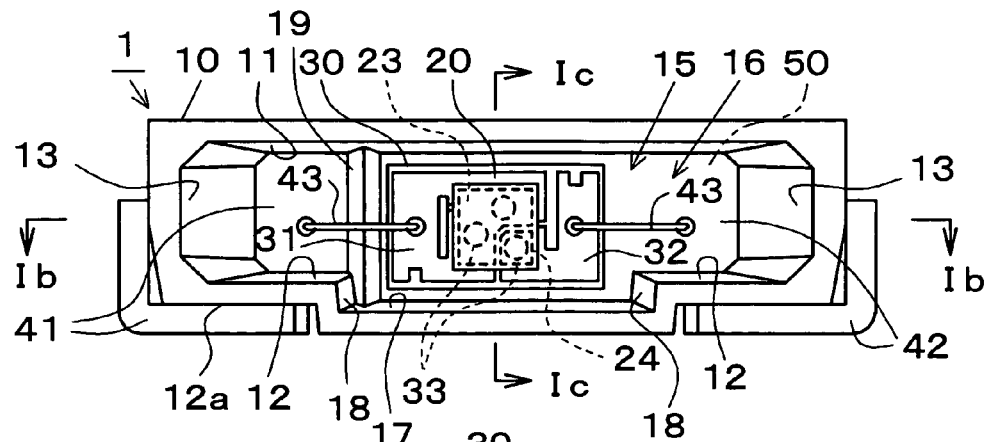

A preferred embodiment according to the present invention will be described hereunder with reference to the accompanying drawings.

A lamp 1 is equipped with a reflection case 10 having an upper wall inner face 11 and a lower wall inner face 12 disposed so as to confront each other at a relatively small interval, right and left side wall inner faces 13 disposed so as to confront each other at a relatively large interval, a back wall inner face 14, a recess portion 15 formed so as to be surrounded by these inner faces, and a front opening 16. A light emitting element 20 is provided to the back wall inner face 14, and the electrodes 23, 24 of the light emitting element 20 are connected to leads 41, 42 provided to the reflection case 10. In the lamp 1 thus constructed, the central portion in the width direction of the lower wall inner face 11 is stepwise lowered to form a lower wall enlarged inner face 17, and the lower wall inner face 12 and the lower wall enlarged inner face 17 are made continuous with each other through right and left perpendicular hanging inner faces 18, so that the central portion in the width direction of the back wall inner face 14 and the central portion in the width direction of the front opening 16 are downwardly enlarged in a rectangular shape. The light emitting element 20 is mounted on the front face of a sub mount table 30 having an erected rectangular plate shape. The back face of the sub mount table 30 is fixed to the central portion in the width direction of the back wall inner face 14, and when the sub mount table 30 is fixed, the right and left end faces of the sub mount table 30 are positioned to the right and left perpendicular hanging inner faces 18.

EXAMPLES

Figure 1B:
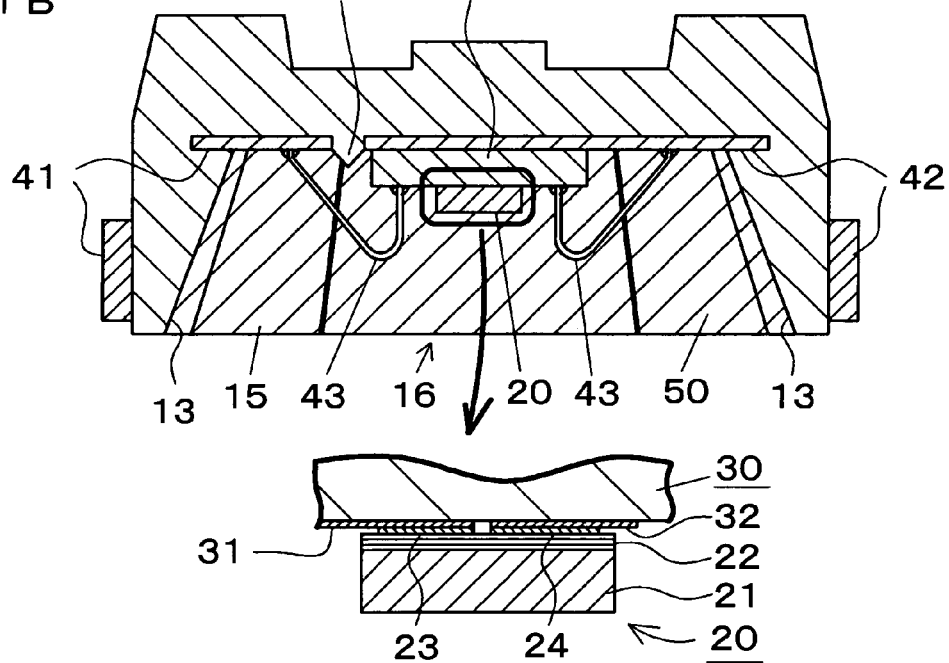
Figure 1C:
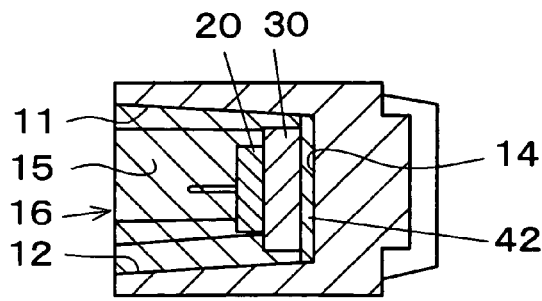
Figure 2A:
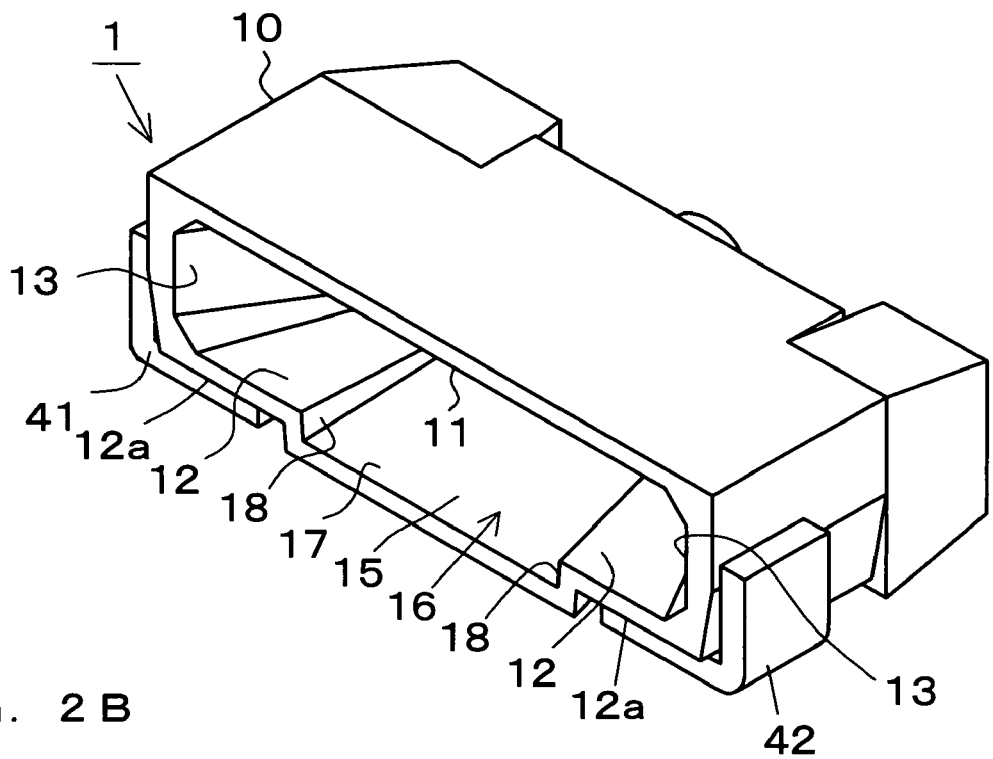
FIG. 2A is a perspective view showing the lamp of the embodiment which is viewed from the front and upper side.
Figure 2B:
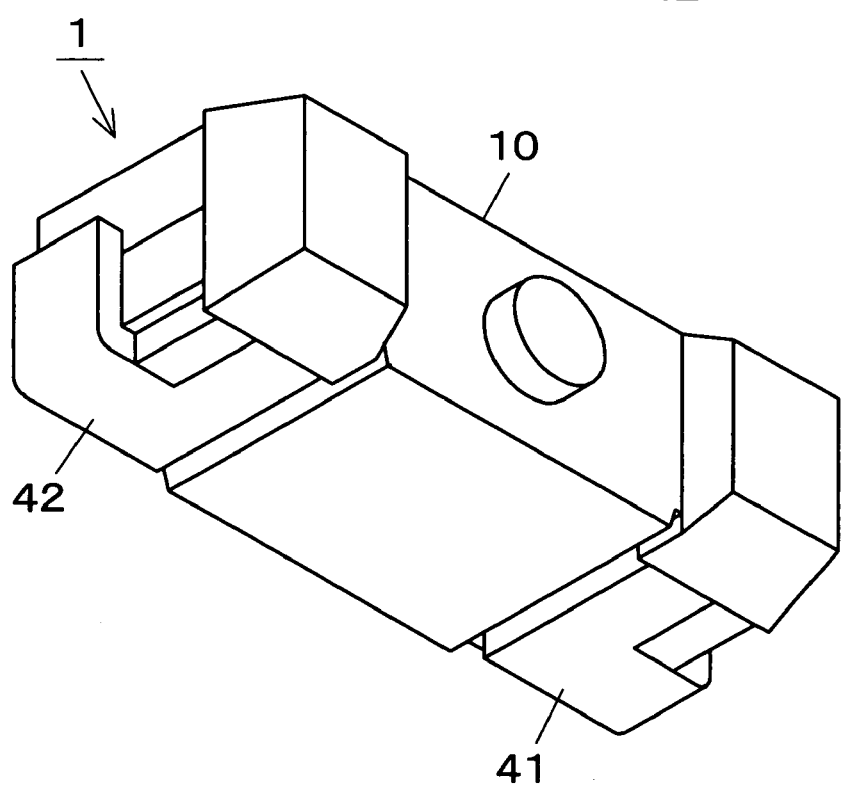
FIG. 2B is a perspective view showing the lamp of the embodiment which is viewed from the back and lower side.
Figure 3:
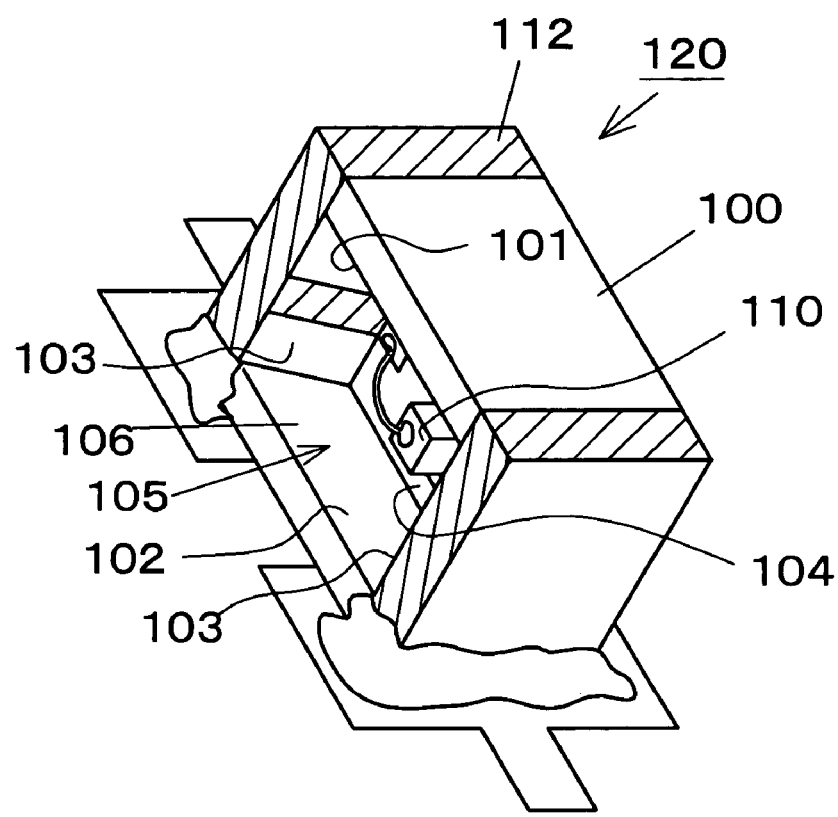
FIG. 3 is a perspective view showing a conventional lamp.
Figure 4A:
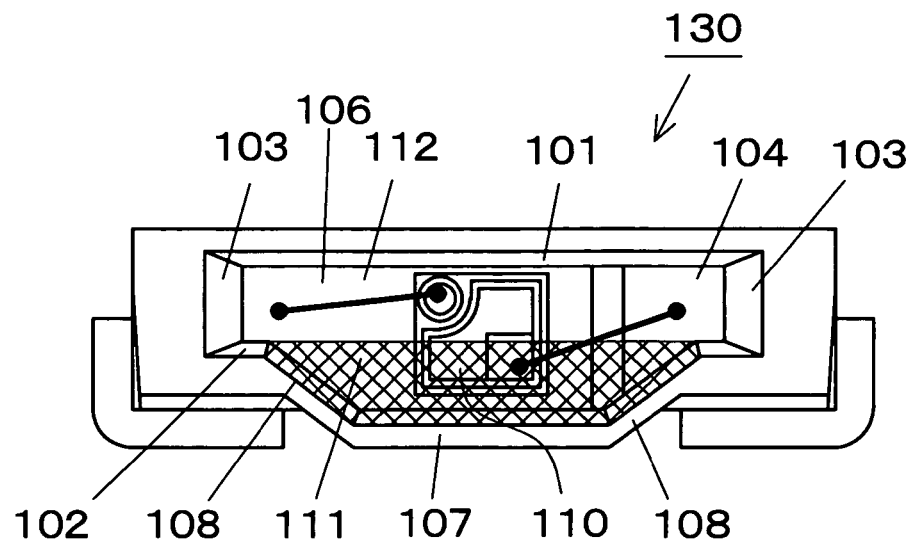
Figure 4B:
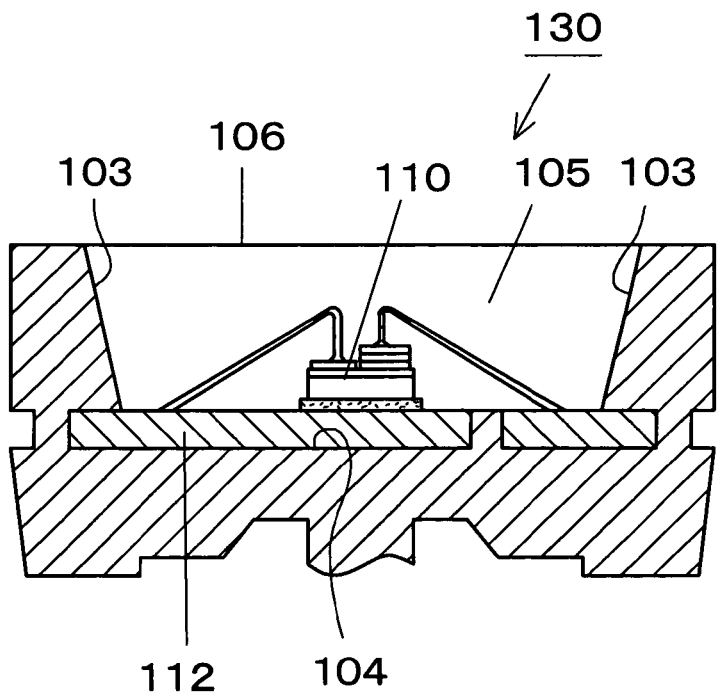

The lamp 1 of the embodiment shown in FIGS. 1 and 2 comprises a white color lamp in which the light emitting element 20 is mounted on the sub mount table 30, the sub mount table 30 is fixed to the reflection case 10, and the electrodes of the light emitting element 20 are connected to the leads 41, 42 provided to the reflection case 10.

The reflection case 10 is formed of nylon resin by injection molding, and it is provided with an upper wall inner face 11, a lower wall inner face 12 and a lower wall enlarged inner face 17 which are disposed so as to confront each other at a relatively small interval, right and left side wall inner faces 13 which are disposed so as to confront each other at a relatively large interval, a back wall inner face 14, a recess portion 15 surrounded by the above inner faces, and a front opening 16.

The central portion in the width direction of the lower wall inner face 12 is stepwise lowered to form the lower wall enlarged inner face 17, and in connection with this construction, the central portion in the width direction of the lower wall outer face (lower face) 12a is also stepwise lowered. The lower wall inner face 12 and the lower wall enlarged inner face 17 are made continuous with each other through right and left perpendicular hanging inner faces 18, so that the central portion in the width direction of the back wall inner face 14 and the central portion in the width direction of the front opening 16 are downwardly enlarged in a rectangular shape. In the figures, the intersecting angle between the handing inner face 18 and the lower wall inner face 12 is set to 95 degrees in consideration of the die-cut or the like after the injection molding. The right and left handing inner faces 18 are designed to be taper faces which the interval therebetween (that is, the lateral width of the lower wall enlarged inner face 17) is more enlarged from the back wall inner face side to the front opening. The interval at the back wall inner face side between the right and left handing inner faces 18, that is, the lateral width of the central portion in the width direction of the back wall inner face 14, is set to 1.0 to 1.1 mm, for example, and it is larger than the lateral width of the sub mount table 30 described later by about 0.3 to 0.5 mm. This resides in the purpose for positioning the right and left end faces of the sub mount table 30. The height of the handing inner faces 18 (that is, the step-down amount from the lower wall inner face 12 to the lower wall enlarged inner face 17) is set to 0.1 to 0.2 mm which is near to the height of the end portion of leads 41 and 42 described later.

The upper wall inner face 11, the lower wall inner face 12 and the lower wall enlarged inner face 17 are designed to be taper faces which the intervals between the upper wall inner face 11 and each of the lower wall inner face 12 and the lower wall enlarged inner face 17 are softly enlarged from the back wall inner face side to the front opening side. The interval at the back wall inner face side between the upper wall inner face 11 and the lower wall inner face 12 is set to 0.4 to 0.45 mm, for example. The interval at the back wall inner face side between the upper wall inner face 11 and the lower wall enlarged inner face 17, that is, the longitudinal width of the central portion in the width direction of the back wall inner face 14, is set to 0.5 to 0.6 mm, for example, and it is larger than the longitudinal width of the sub mount table 30 described later by about 0.1 to 0.2 mm. This resides in the purpose for positioning the upper and lower end faces of the sub mount table 30.

The right and left side wall inner faces 13 are designed to be taper faces which the interval therebetween is enlarged from the back wall inner face side to the front opening. The interval at the back wall inner face side between the right and left side wall inner faces 13 is set to 1.5 to 2.5 mm, for example.

The anode and cathode leads 41 and 42 are formed by bending strip-shaped metal plates, and they are inserted in the injection molding process of the reflection case 10, respectively. The anode lead 41 is disposed at the left side when viewed from the front side, and one end side thereof is exposed to the left side of the back wall inner face 14 while the other end side extends to the lower side of the lower wall outer face 12a. The cathode lead 42 is provided at the right side when viewed from the front side, and one end side thereof is exposed from the right side of the back wall inner face 14 to the central portion in the width direction while the other end side extends to the lower side of the lower wall outer face 12a. Between one end of the anode lead 41 and one end of the cathode lead 42, the material of the reflection case 10 is interposed to form a gently projecting portion 19, thereby preventing floating of the leads 41 and 42 and insulating the leads from each other.

The LED chip having the flip chip structure used as the light emitting element 20 in this embodiment is a gallium nitride type blue-color LED chip comprising a sapphire substrate 21, a semiconductor laminate portion 22, and a p-electrode 23 having a relatively large area and an n-electrode 24 having a relatively small area which are provided at the same face side. The chip size is set to about 0.2 to 0.5 mm in lateral width and about 0.2 to 0.5 mm in longitudinal width.

The sub mount table 30 is formed of AlN ceramics and designed in an erected rectangular plate shape. The size is set to 0.6 to 0.7 mm in lateral width, 0.4 to 0.5 mm in longitudinal width and 0.1 to 0.2 mm in thickness, for example. Anode and cathode metal patterns 31 and 32 are disposed on the front face of the sub mount table 30. Each of the metal patterns 31, 32 comprises a lower layer of Au and an upper layer of Al. Two bumps 33 of Au are provided on the anode metal pattern 31, and one bump 33 of Au is provided on the cathode metal pattern 32.

The light emitting element 20 is mounted on the sub mount table 30 by connecting the p-electrode 23 and the n-electrode 24 to the anode metal pattern 31 and the cathode metal pattern 32 of the sub mount table 30 through the foregoing bumps 33. Since the connection is carried out through the totaled three bumps 33, the posture of the light emitting element 20 is stabilized. The sub mount table 30 is formed to have an erected rectangular plate shape which is longer laterally than the lateral width of the light emitting element 20, and thus the anode metal pattern 31 and the cathode metal pattern 32 are exposed to the front side at the left-handed side and the right-handed side of the light emitting element 20, respectively (for wire bonding to the leads).

The sub mount table 30 on which the light emitting element 20 is mounted is fixed onto the cathode lead 42 exposed to the central portion in the width direction of the back wall inner face 14 by silver paste or the like. When the fixing is carried out, the right and left end faces of the sub mount table 30 are positioned by the right and left handing inner faces 18, and the upper and lower end faces of the sub mount table 30 are positioned by the upper wall inner face 11 and the lower wall enlarged inner face 17. Furthermore, the anode metal pattern 31 and the anode lead 41, and the cathode metal pattern 32 and the cathode lead 42 are bonded to each other by wires 43.

A sealing resin 50 (for example, silicon resin) contaminated with a fluorescent material (for example, Ce:YAG) for emitting fluorescent light having complementary color relation is filled in the recess portion 15 of the reflection case 10, and the light emitting element 20 and the wires 43 are sealed and protected by the sealing resin 50.

The lamp 1 thus constructed is manufactured according to the following process.

(1) The leads 41 and 42 are set in a mold (not shown), and a nylon resin is injected into the mold to form the reflection case 10 in which the leads 41 and 42 are inserted. In this injection molding step, a number of reflection cases 10 are simultaneously formed, and they are connected to one another by runners.

(2) The three bumps 33 are prepared at predetermined positions of the sub mount table 30 on which the metal patterns 31 and 33 are disposed.

(3) The light emitting element 20 is connected to the bumps 33 prepared on the sub mount table 30.

(4) The sub mount table 30 integrated with the light emitting element 20 is fixed in the recess portion on the cathode lead 42 of the reflection case 10 by silver paste. Since silver paste is used, heat of the light emitting element 20 is efficiently transferred through the sub mount table 30 to the cathode lead 42 and the reflection case 10. The silver paste may be replaced by solder.

(5) The metal patterns 31 and 32 of the fixed sub mount table 30 and the leads 41 and 42 are bonded by wires.

(6) Sealing resin 50 contaminated with fluorescent material is filled in the recess portion 15 of the reflection case 10.

(7) The reflection cases 10 connected to one another by runners as described above are separated from one another, and the other end sides of the leads 41, 42 are bent downward to complete the lamp 1.

According to the lamp 1 of this embodiment, the following operating advantages can be achieved.

(a) The light emitting element 20 can be easily mounted on the sub mount table 30 (in the state that it is not fixed to the reflection case 10).

(b) When the sub mount table 30 is fixed to the back wall inner face 14 of the reflection case 10 (in this embodiment, to the lead 42 on the back wall inner face 14), the positioning can be automatically performed by the right and left handing inner faces 18. Accordingly, the subsequent wire connection can be easily performed because the position is fixed, and also the light condensing degree of the reflection case 10 can be kept constant.

(c) The light emitting element 20 having the flip chip structure is mounted on the sub mount table 30, and the sub mount table 30 is fixed to the lead 42. Therefore, the heat of the light emitting element 20 can be efficiently exhausted.

The present invention is not limited to the above embodiment, and various modifications may be properly made without departing from the subject matter of the present invention.

What is claimed is:

1. A lamp comprising:
a reflection case having upper and lower wall inner faces disposed so as to confront each other at a relatively small interval, right and left side wall inner faces disposed so as to confront each other at a relatively large interval, a back wall inner face, a recess portion formed so as to be surrounded by the above inner faces, and a front opening;
a light emitting element provided on said back wall inner face, electrodes of said light emitting element being connected to leads provided to the reflection case;
a central portion in the width direction of said lower wall inner face being stepwise lowered to form a lower wall enlarged inner face, said lower wall inner face and said lower wall enlarged inner face being made continuous with each other through right and left perpendicular hanging inner faces, thus a central portion in the width direction of said back wall inner face and a central portion in the width direction of said front opening being downwardly enlarged in a rectangular shape, respectively;
said light emitting element being mounted on a front face of a sub mount table having an erected rectangular plate shape,
a back face of said sub mount table being fixed to the central portion in the width direction of said back wall inner face; and
right and left end faces of said sub mount table being positioned to said right and left perpendicular hanging inner faces when said sub mount table is fixed.

2. The lamp according to claim 1,
wherein said light emitting element comprises an LED chip having a flip chip structure, and an n-electrode and a p-electrode of said LED chip are connected to a metal pattern disposed on the front face of said sub mount table through bumps.

3. The lamp according to claim 2,
wherein said sub mount table is designed to have an erected rectangular plate shape that is longer laterally than the lateral width of said LED chip so that said metal pattern is exposed to the front side at the left and right sides of said LED chip.

4. The lamp according to claims 1,
wherein said lead is exposed to at least the central portion in the width direction of said back wall inner face, and the back side of said sub mount table is fixed to said lead.

5. The lamp according to claims 2,
wherein said lead is exposed to at least the central portion in the width direction of said back wall inner face, and the back side of said sub mount table is fixed to said lead.

6. The lamp according to claims 3,
wherein said lead is exposed to at least the central portion in the width direction of said back wall inner face, and the back side of said sub mount table is fixed to said lead.

* * * * *